United States Patent
Bazes

(10) Patent No.: US 7,123,066 B2
(45) Date of Patent: *Oct. 17, 2006

(54) SPEED-LOCKED LOOP TO PROVIDE SPEED INFORMATION BASED ON DIE OPERATING CONDITIONS

(75) Inventor: Mel Bazes, Haifa (IL)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/047,796

(22) Filed: Jan. 31, 2005

(65) Prior Publication Data

US 2005/0140409 A1  Jun. 30, 2005

Related U.S. Application Data

(63) Continuation of application No. 10/456,030, filed on Jun. 6, 2003, now Pat. No. 6,982,580, which is a continuation of application No. 09/550,452, filed on Apr. 17, 2000, now Pat. No. 6,633,186.

(51) Int. Cl.
  *H03L 7/06* (2006.01)
(52) U.S. Cl. .................................... 327/158
(58) Field of Classification Search ........ 327/146–151, 327/156–160, 161
  See application file for complete search history.

(56) References Cited

U.S. PATENT DOCUMENTS

| | | | |
|---|---|---|---|
| 4,922,141 A | 5/1990 | Lofgren et al. | 327/158 |
| 5,347,234 A | 9/1994 | Gersbach et al. | 331/57 |
| 5,382,921 A | 1/1995 | Estrada et al. | 331/17 |
| 5,428,309 A | 6/1995 | Yamauchi et al. | 327/158 |
| 5,687,202 A | 11/1997 | Eitrheim | 375/376 |
| 5,982,833 A | 11/1999 | Waters | 375/372 |
| 5,994,933 A | 11/1999 | Yamanaka et al. | 327/158 |
| 6,005,904 A | 12/1999 | Knapp et al. | 375/370 |
| 6,028,488 A | 2/2000 | Landman et al. | 331/1 A |
| 6,044,122 A | 3/2000 | Ellersick et al. | 375/360 |
| 6,052,034 A | 4/2000 | Wang et al. | 331/2 |
| 6,081,146 A | 6/2000 | Shiochi et al. | 327/277 |
| 6,188,288 B1 | 2/2001 | Ragan et al. | 331/16 |
| 6,633,186 B1 | 10/2003 | Bazes | 327/159 |

*Primary Examiner*—Quan Tra
(74) *Attorney, Agent, or Firm*—Blakely, Sokoloff, Taylor & Zafman LLP

(57) ABSTRACT

A speed-locked loop (SLL) circuit to automatically determine overall chip speed, which is a function of the combination of supply voltage, temperature, and processing parameters, and to output the speed information in digital form to speed-compensating circuits in order to significantly reduce their sensitivity to operating conditions. Through negative feedback, a digitally controlled ring oscillator (DCO) is forced to lock at an oscillation frequency close to that specified by a six-bit speed constant input. A three-bit control bus varies the DCO oscillation frequency under digital control until the SLL achieves lock. When the SLL has achieved lock it latches the DCO control bus and outputs it as the speed information. The speed constant input may be varied under software control in order to determine the speed constant value that optimizes performance of speed-compensating circuits under SLL control.

7 Claims, 4 Drawing Sheets

SPEED-LOCKED LOOP TO PROVIDE SPEED INFORMATION BASED ON DIE OPERATING CONDITIONS

The present application is a continuation of U.S. patent application Ser. No. 10/456,030, filed Jun. 6, 2003 now U.S. Pat. No. 6,982,580, which is a continuation of U.S. patent application Ser. No. 09/550,452, filed Apr. 17, 2000, now U.S. Pat. No. 6,633,186, issued Oct. 14, 2003.

FIELD

The present invention relates to circuits, and more particularly, to a control circuit for compensating other circuits to meet performance specifications over a range of operating conditions.

BACKGROUND

Designing circuits to meet stringent performance specifications over a wide range of operating conditions generally requires using precision references. By coupling circuit operation to a highly stable, precision reference, the influence of even large variations in supply voltage, temperature, and processing parameters on circuit performance can be minimized or even entirely eliminated. Familiar examples of precision references are crystal oscillators, bandgap voltage references, and precision external resistors.

Referenced-based circuits often are analog in nature and suffer from sensitivity to voltage supply noise. Designing such referenced-based circuits to operate in the presence of voltage supply noise can be very challenging. If a circuit could be designed to meet stringent performance specifications without relying on precision references, circuit design in many cases would become simpler.

It is therefore desirable to provide an alternative approach to relying on precision references to compensate a circuit for actual operating conditions, i.e., supply voltage, temperature, and processing parameters. The present invention addresses this issue.

DESCRIPTION OF EMBODIMENTS

Embodiments of the present invention utilize a speed-locked loop (SLL) to provide information needed for compensating circuits as a function of operating conditions. The SLL determines the overall speed of the die or chip containing the SLL, and outputs this speed information in encoded digital form for use in compensating other circuits on the same die, such as, but not limited to, output buffers or drivers.

A circuit may compensate itself for operating conditions by turning parallel-connected devices on or off as a function of the SLL speed information. For example, if the SLL speed information indicates slow operating conditions, then a speed-compensating circuit will turn on more devices in parallel in order to increase its speed. Conversely, if the SLL speed information indicates fast operating conditions, then a speed-compensating circuit will turn off devices in parallel in order to decrease its speed.

Turning devices off as overall speed increases reduces buffer switching noise. With fewer devices switching under fast conditions, switching transients that create noise in buffer supplies and the die substrate are correspondingly smaller.

The disclosed embodiments for the SLL resolve operating conditions into eight different speed levels, so that a speed-compensating circuit can choose from up to eight different combinations of parallel-connected devices in order to compensate for operating conditions. In other embodiments, the SLL may be designed to resolve operating conditions into more than or less than eight speed levels. It is found through simulation that eight speed levels appear to suffice for most compensation requirements.

Figure 1:
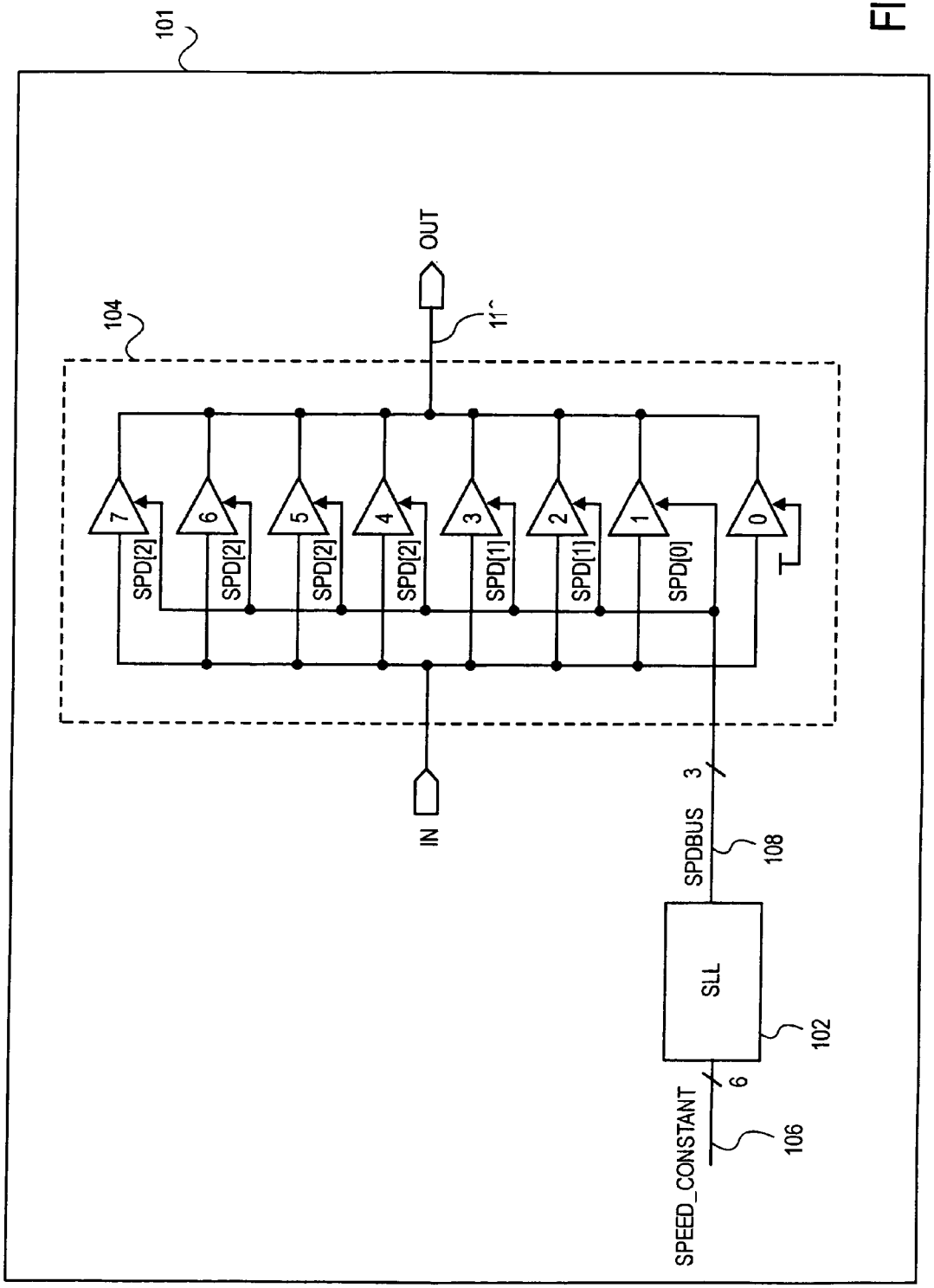
FIG. 1 is a high-level abstraction of a speed-locked loop circuit and a speed-compensating driver integrated on a die according to an embodiment of the present invention.

FIG. 1 illustrates an embodiment of the present invention. Integrated on die 101 are SLL 102 and speed-compensating driver 104. The input to SLL 102 is SPEED_CONSTANT 106, which for the embodiment of FIG. 1 is a six-bit bus. The output of SLL 102 is SPDBUS (Speed Bus) 108, which for the embodiment of FIG. 1 is a three-bit bus.

SLL 102 outputs information on SPDBUS 108 on the operating corner of the die in which SLL 102 resides. The operating corner may include, among other things, the combination of process file, supply voltage, and temperature. Both SLL 102 and driver 104 reside on the same die. The output information on SPDBUS 108 is used to compensate the speed of driver 104 in order to reduce its parametric variability. In the embodiment of FIG. 1, SSL 102 outputs on SPDBUS 108 the three-bit output 000 to designate the fastest operating conditions and the three-bit output 111 to designate the slowest operating conditions. Other output values would designate intermediate operating conditions, where smaller output values denote faster operating conditions.

The speed of driver 104 is compensated depending upon how many parallel-connected buffers are enabled. Driver 104 comprises eight parallel-connected buffers, labeled 0 through 7. An arrow indicates the enable input to each buffer. The enable inputs of four of the buffers, indicated as buffers 4, 5, 6, and 7, are connected to the second bit line of SPDBUS 108, denoted as SPD[2], whose relative weight is four. The enable inputs of two of the buffers, indicated as buffers 2 and 3, are connected to the first bit line of SPDBUS 108, denoted as SPD[1], whose relative weight is two. The enable input of one of the buffers, indicated as buffer 1, is connected to the zeroth bit line of SPDBUS 108, denoted as SPD[0], whose relative weight is one. A single buffer, denoted as buffer 0, is continuously enabled independently of SPDBUS 108.

In the slowest operating corner, SLL 102 outputs 111 on SPDBUS 108, in which case all eight buffers are enabled. By turning on all buffers, the speed of driver 104 is compensated for the slowest operating corner. For the fastest operating corner, SLL 102 outputs 000 on SPDBUS 108, so that only one buffer is enabled to compensate the speed of driver 104. For intermediate conditions, SLL 102 would output on SPDBUS 108 values between 000 and 111 so that various numbers of buffers are enabled. In this way, SLL 102 compensates the speed of driver 104 for various operating corners, thereby greatly reducing the variability of the speed of driver 104.

Figure 2:
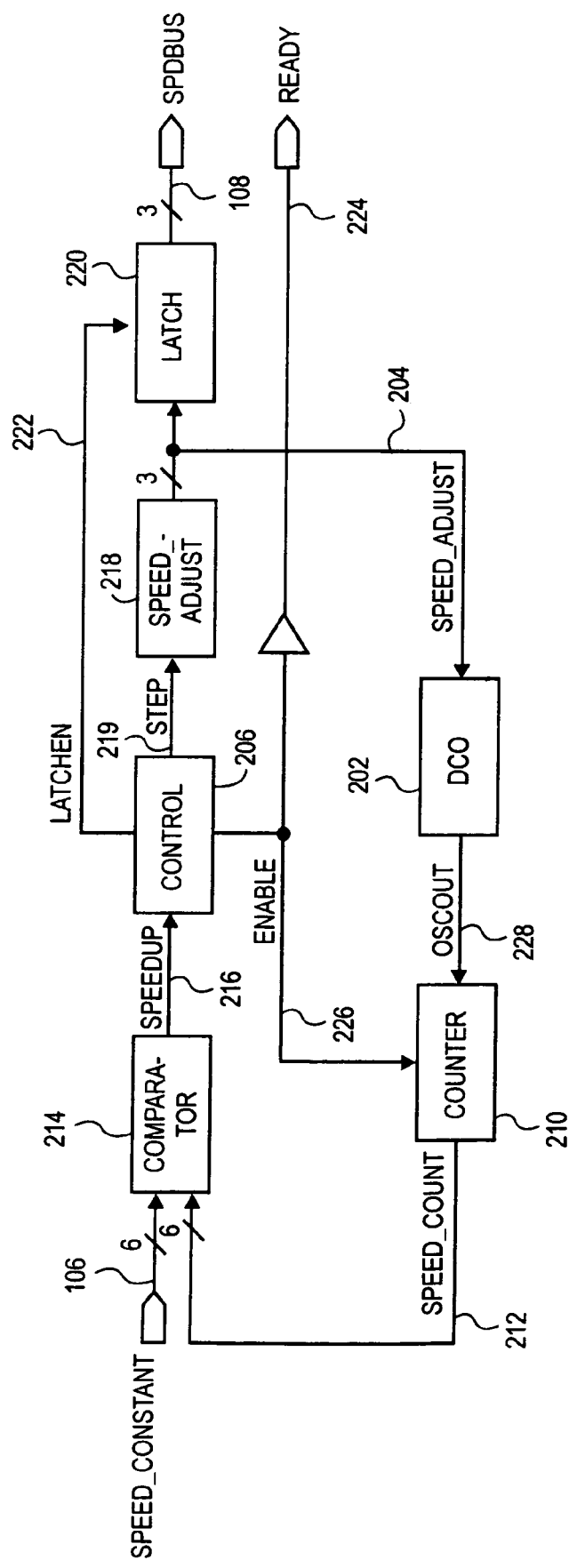
FIG. 2 is a speed-locked loop circuit according to an embodiment of the present invention.

FIG. 2 provides an embodiment of SLL 102. Digitally controlled ring oscillator (DCO) 202 oscillates at a frequency determined by the combination of supply voltage, temperature, and processing parameters. The oscillation frequency of DCO 202 is adjustable over a wide range of values through three-bit bus SPEED_ADJUST 204. DCO 202 resides within a control loop that, under control of control functional unit 206, adjusts the frequency of DCO 202 through SPEED_ADJUST 204 until the frequency of DCO 202 locks at a frequency near, but somewhat higher than, that specified by SPEED_CONSTANT 106. For the particular embodiment of FIG. 2, because SPEED_ADJUST 204 is three bits wide, DCO 202 can be adjusted to one of eight possible frequencies under a particular set of operating conditions. Because DCO 202 is adjustable to only one out of eight possible oscillation frequencies, it is practically impossible for DCO 202 to lock exactly at the frequency specified by SPEED_CONSTANT 106. The control loop locks DCO 202 at the frequency that is closest to, but still larger than, that specified by SPEED_CONSTANT 106.

Figure 3:
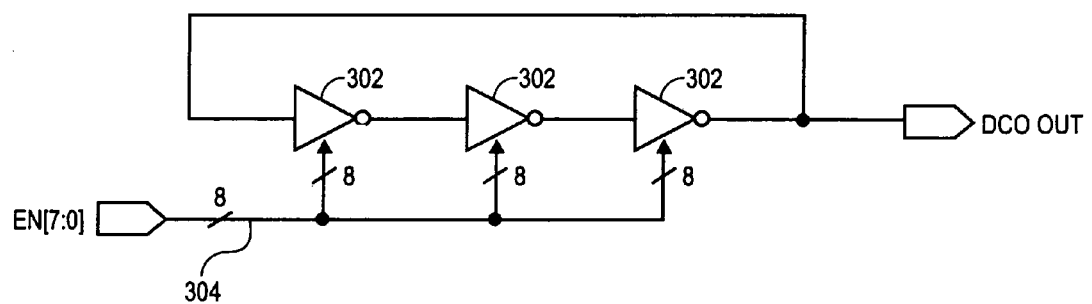
FIG. 3 is a digitally controlled ring oscillator according to an embodiment of the present invention.

FIG. 3 illustrates a simplified circuit for DCO 202. In the embodiment of FIG. 3, DCO 202 is a ring oscillator comprising three identical inverters 302 whose speed is controlled by an eight-line enable bus EN[7:0] 304. From one to eight enable lines of bus EN[7:0] 304 may be asserted.

Figure 4:
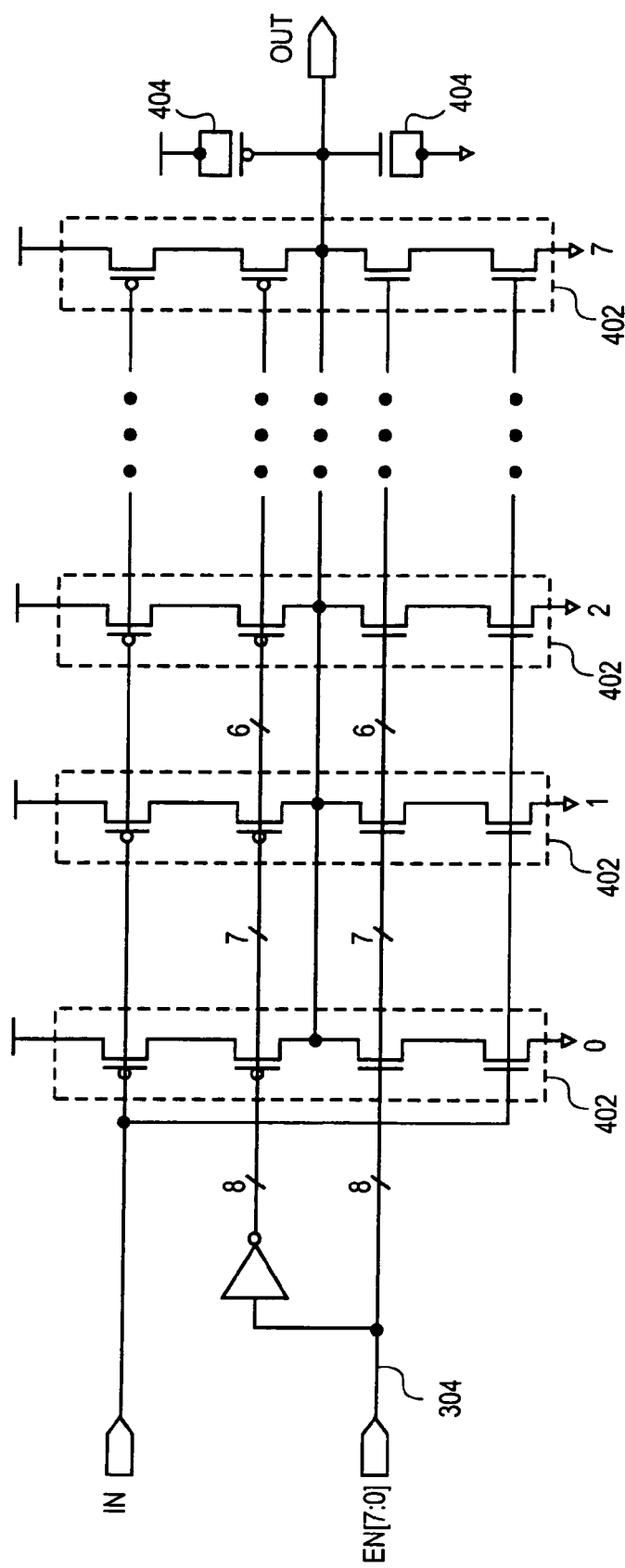
FIG. 4 is an inverter circuit utilized within the digitally controlled ring oscillator of FIG. 3.

FIG. 4 is a circuit diagram for inverter 302. Inverter 302 comprises eight tri-state inverters 402 connected in parallel, where each inverter 402 may be enabled by one of the enable lines of bus EN[7:0] 304. Each inverter 402 comprises a pair of n-type MOS (Metal Oxide Semiconductor) devices connected in complementary fashion with a pair of p-type MOS devices. The outputs of all eight inverters 402 are connected together to CMOS load capacitors 404. The more enable lines that are asserted, the more buffers that are enabled and the higher the speed of inverter 302 and, consequently, the higher the frequency of DCO 202.

Referring back to FIG. 2, the frequency of DCO 202 is adjusted in a three-step update cycle, as follows: Counter 210 outputs a value indicative of the DOC frequency in the form of six-bit SPEED_COUNT word 212. This is accomplished by control functional unit 206 asserting ENABLE signal 226 to reset counter 210, after which counter 210 begins counting each pulse of the output signal provided by DCO 202, denoted as output signal OSCOUT 228. After some constant number of clocks, ENABLE signal 226 is de-asserted by control functional unit 206, and counter 210 stops counting.

Comparator 214 compares SPEED_COUNT 212 to SPEED_CONSTANT 106, and outputs SPEEDUP control signal 216. If SPEED_CONSTANT 106≧SPEED_COUNT 212, then comparator 214 brings SPEEDUP signal 216 HIGH, thereby signaling to control functional unit 206 that the DCO frequency should be increased. Conversely, if SPEED_CONSTANT 106<SPEED_COUNT 212, then comparator 214 brings SPEEDUP signal 216 LOW, thereby signaling to control functional unit 206 that the DCO frequency should be decreased.

Control functional unit 206 steps SPEED_ADJUST counter 218 according to the logic level of SPEEDUP 216. If SPEEDUP 216 is HIGH, then SPEED_ADJUST counter 218 is incremented, and conversely, if SPEEDUP 216 is LOW, then SPEED_ADJUST counter 218 is decremented.

However, SPEED_ADJUST counter 218 is controlled in such a way that when it is already at its maximum value, it does not rollover to its minimum value if SPEEDUP 216 is HIGH. Similarly, if SPEED_ADJUST counter 218 is already at its minimum value, it does not rollover to it maximum value if SPEEDUP 216 is LOW. In other words, SPEED_ADJUST counter 218 does not increment past its maximum value to zero, and does not decrement past zero to its maximum value.

It is immaterial whether the above-described characteristic of SPEED_ADJUST counter 218 is inherent, or realized via control functional unit 206. In one embodiment, control functional unit 206 increments or decrements SPEED_ADJUST counter 218 via STEP signal 219 as follows: Control functional unit 206 provides an enable signal to SPEED_ADJUST counter 218, and sets STEP signal 219 HIGH if SPEEDUP 216 is HIGH, and sets STEP signal 219 LOW if SPEEDUP 216 is LOW. SPEED_ADJUST counter 218 is designed in such a way that, only if it is enabled, it increments if STEP signal 219 is HIGH, and decrements if STEP signal 219 is LOW. Control functional unit 206 does not enable SPEED_ADJUST counter 218 if STEP signal 219 is HIGH and SPEED_ADJUST counter 218 is already at its maximum value, and it does not enable SPEED_ADJUST counter 218 if STEP signal 219 is LOW and SPEED_ADJUST counter 218 is already at its minimum value. SPEED_ADJUST counter 218 is enabled otherwise. Other embodiments may be realized so that SPEED_ADJUST counter 218 does not increment past its maximum value, and does not decrement past its minimum value.

SPEED_ADJUST bus 204 provides the value of SPEED_ADJUST counter 218 to DCO 202. DCO 202 decodes the three-bit value of SPEED_ADJUST bus 204 and asserts the appropriate number of enable lines of bus EN[7:0] 304 to adjust its frequency. The three-bit value 000 on SPEED_ADJUST bus 204 is decoded such that only one enable line of bus EN[7:0] 304 is HIGH, whereas the three-bit value 111 on SPEED_ADJUST bus 204 is decoded such that all eight enable lines of bus EN[7:0] 304 are HIGH. Intermediate values of SPEED_ADJUST bus 204 are decoded accordingly, so that values on SPEED_ADJUST bus 204 are decoded in binary fashion.

The above-described update cycle is repeated continuously. Note that in every update cycle, the DCO frequency is either increased or decreased. Steady state (lock) is attained when SPEEDUP 216 goes HIGH and LOW on alternate update cycles. Likewise during lock, SPEED_ADJUST counter 218 alternates between two values on alternate cycles, whose difference is one. The higher of these two values is latched in latch 220 by control functional unit 206 asserting LATCHEN 222, and the value latched in latch 220 is provided on SPDBUS 108. The output of SPDBUS 108 is the speed information provided to other speed-compensating circuits for controlling their speed, such as speed-compensating driver 104.

In one embodiment, to provide on SPDBUS 108 the higher of the two alternating values of SPEED_ADJUST 204 when lock is reached, control functional unit 206 asserts LATCHEN 222 only if SPEED_ADJUST 204 increases or only if SPEED_ADJUST 204 reaches 000 in at least two successive update cycles. In this way, SPDBUS 108 is prevented from toggling between the two values of SPEED_ADJUST 204 when lock is reached. In another embodiment, LATCHEN 222 is asserted only if SPEED_ADJUST 204 increases or only if SPEED_ADJUST 204 decreases in value for two successive cycles. Clearly, many other methods may be employed.

Because the update cycle is repeated continuously, SPDBUS 108 tracks slow changes in chip speed that stem from changes in supply voltage, temperature, and aging. READY signal 224 signals circuits using SPDBUS 108 that SLL 102 has attained lock and that the information on SPDBUS 108 is valid.

Control functional unit 206 may be realized, among other things, as an ASIC (Application Specific Integrated Circuit), a PLA (Programmable Logic Array), or a programmable microprocessor core under control of software or firmware. SPEED_CONSTANT 106 may, for example, be controlled by software. The value for SPEED_CONSTANT 106 may be chosen in circuit simulations in order to optimize performance over all operating conditions. One approach is to select a value for SPEED_CONSTANT 106 that would result in a value of 011 for SPDBUS 108 under nominal conditions, i.e., typical processing, nominal supply voltage, and nominal temperature (usually 60 degrees Celsius). Another approach is to select a value for SPEED_CONSTANT 106 that would result in a value of 111 for SPDBUS 108 under the slowest operating conditions. Alternatively, the value for SPEED_CONSTANT 106 may be selected dynamically during production testing so as to maximize production yield.

Various modifications may be made to the above-described embodiments without departing from scope of the invention as claimed below. For example, an embodiment SLL may be designed so that the frequency of DCO 202 is increased if SPEED_CONSTANT 106>SPEED_COUNT 212, and is decreased if SPEED_CONSTANT 106≦SPEED_COUNT 212. For another embodiment SLL, latch 220 may be controlled so as to latch onto the smaller of the two values of SPEED_ADJUST 204 when lock is achieved.

What is claimed is:

1. A die having an operating condition, the die comprising:
    an output bus;
    a speed-locked loop to provide on the output bus a value indicative of the operating condition and to provide a ready signal indicative of whether the speed-locked loop has attained lock; and
    a speed-compensating circuit responsive to the output bus value if the ready signal indicates lock;
    wherein the speed-locked loop comprises:
    a digitally controlled oscillator(DCO) having a frequency;
    a first counter coupled to an output of the DCO to provide a first counter value indicative of the oscillator frequency, the first counter value being a digital value having a plurality of bits and each bit being one of logically high and logically low values;
    an input bus having predetermined bits representing an input bus value;
    a comparator to compare the first counter value to the input bus value to generate a first signal indicating whether to increase or decrease the frequency of the DCO; and
    a control functional unit coupled to the comparator and the oscillator, in response to the first signal, to generate a second signal to decrease the oscillator frequency if the counter and input bus values satisfy a first relationship and to increase the oscillator frequency if the counter and input bus values satisfy a second relationship.

2. The die as set forth in claim 1, wherein the first counter and input bus values have the first relationship if the input bus value is greater than or equal to the first counter value and have the second relationship if the input bus value is less than the first counter value.

3. The die as set forth in claim 1, wherein the speed-locked loop further comprises a second counter coupled to the control functional unit and the DCO, wherein the second counter, in response to the second signal from the control functional unit, is configured to generate a second counter value having predetermined bits indicating how the frequency of the DCO is to be adjusted.

4. The die as set forth in claim 3, wherein the speed-locked loop further comprises a latch circuit coupled to the second counter to latch the second counter value to be applied onto the output bus to be used by the speed-compensating circuit.

5. The die as set forth in claim 4, wherein the control functional unit is further configured to control the first counter, including staring and stopping counting the frequency of the DCO for a respective cycle.

6. The die as set forth in claim 5, wherein the control functional unit is configured to assert a control signal to reset the second counter and the second counter starts counting the frequency of the DCO after the reset, and wherein the control functional unit is configured to de-assert the control signal to have the second counter stop counting.

7. The die as set forth in claim 6, wherein the control signal is used as a part of the ready signal indicative of whether the speed-locked loop has attained lock.

* * * * *